(12) United States Patent
Matam et al.

(10) Patent No.: US 12,718,853 B1
(45) Date of Patent: Aug. 25, 2026

(54) POWER GATING FOR MEMORY REPEATER CIRCUITS

(71) Applicant: Apple Inc., Cupertino, CA (US)

(72) Inventors: Srikar Pradyumna Matam, Cupertino, CA (US); Zhen Liu, Austin, TX (US); Michael A. Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 164 days.

(21) Appl. No.: 18/810,059

(22) Filed: Aug. 20, 2024

(51) Int. Cl.
*G11C 7/10* (2006.01)

(52) U.S. Cl.
CPC ............ *G11C 7/1069* (2013.01); *G11C 7/106* (2013.01)

(58) Field of Classification Search
CPC .............................. G11C 7/1069; G11C 7/106
See application file for complete search history.

(56) References Cited

U.S. PATENT DOCUMENTS

| | | | | |
|---|---|---|---|---|
| 9,530,459 | B2 | 12/2016 | Mitsubori et al. | |
| 10,409,741 | B2 | 9/2019 | Ku | |
| 11,837,320 | B2 * | 12/2023 | Kang | G11C 7/222 |
| 2013/0322162 | A1 * | 12/2013 | Lee | G11C 11/1675 365/158 |
| 2014/0192583 | A1 * | 7/2014 | Rajan | G11C 5/06 365/63 |
| 2017/0289850 | A1 | 10/2017 | Nale et al. | |
| 2023/0186960 | A1 | 6/2023 | Kim et al. | |
| 2023/0385983 | A1 | 11/2023 | Kvasnica et al. | |
| 2024/0036745 | A1 * | 2/2024 | Hong | G06F 3/0625 |

FOREIGN PATENT DOCUMENTS

| | | | |
|---|---|---|---|
| KR | 100728570 | B1 | 6/2007 |
| KR | 100751674 | B1 | 8/2007 |
| KR | 20080087441 | A | 10/2008 |
| KR | 100988811 | B1 | 7/2010 |
| KR | 20210133832 | A | 11/2021 |
| WO | 2023091093 | A1 | 5/2023 |

* cited by examiner

*Primary Examiner* — Jerome Leboeuf
(74) *Attorney, Agent, or Firm* — Kowert, Hood, Munyon, Rankin & Goetzel, P.C.; Scott W. Pape; Dean M. Munyon

(57) ABSTRACT

An apparatus may include a memory controller circuit, and a first memory circuit coupled to the memory controller circuit. The first memory circuit may include a plurality of first memory cells, first local access circuitry, and a first set of repeater circuits. The apparatus may further include a second memory circuit coupled to the first set of repeater circuits. The second memory circuit may include a plurality of second memory cells and second local access circuitry. The memory controller circuit may be configured to place the first memory circuit into a reduced power state and access the second memory circuit via the first set of repeater circuits.

20 Claims, 8 Drawing Sheets

400

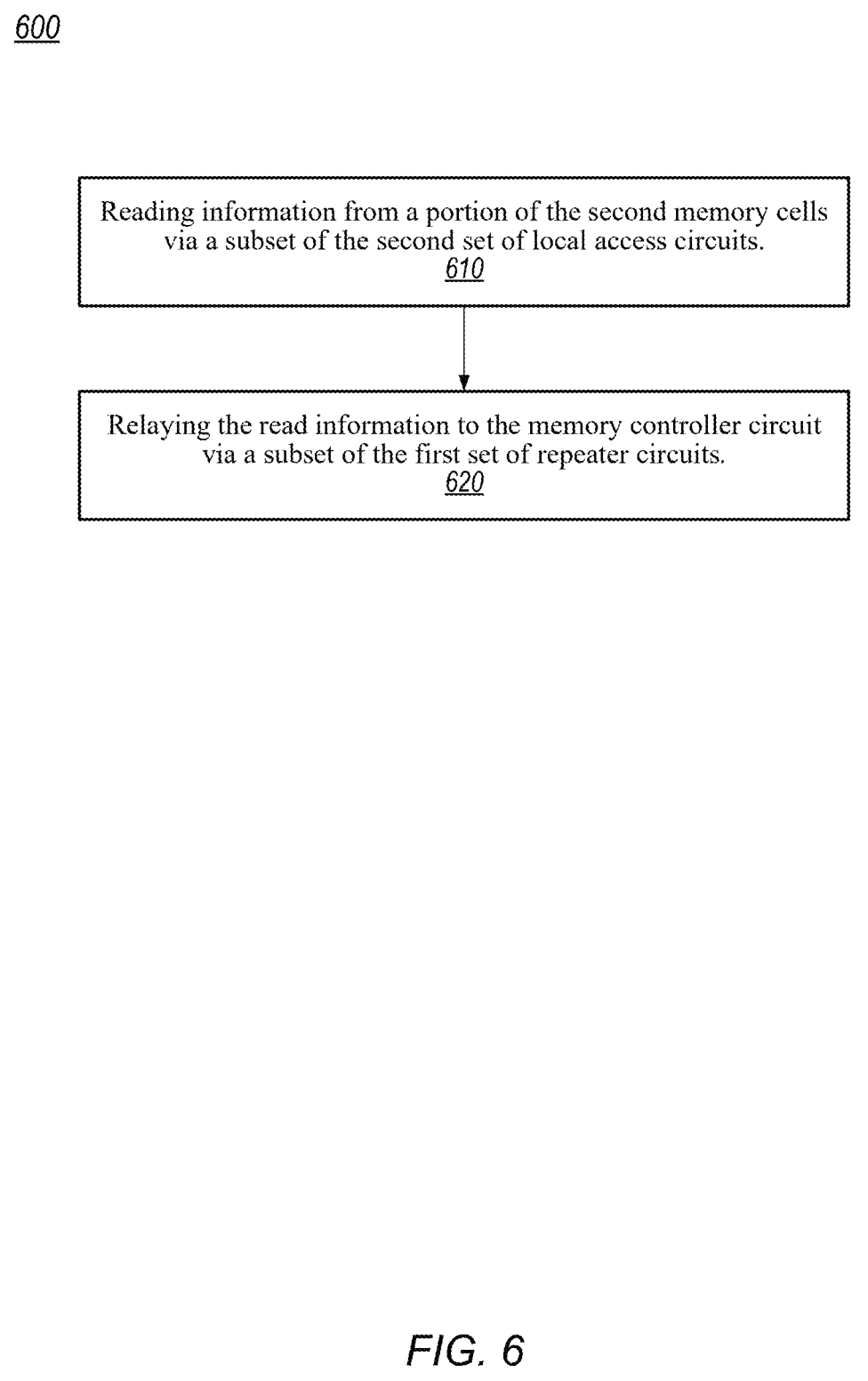

600

Reading information from a portion of the second memory cells via a subset of the second set of local access circuits.
610

Relaying the read information to the memory controller circuit via a subset of the first set of repeater circuits.
620

FIG. 6

POWER GATING FOR MEMORY REPEATER CIRCUITS

BACKGROUND

Technical Field

Embodiments described herein are related to computer systems, including systems-on-a-chip (SOCs) and multi-die packages. More particularly, the disclosed embodiments are directed towards methods for managing operation of a repeater circuit in a memory array.

Description of the Related Art

Computer systems, including systems-on-chip (SOCs), may include a memory system comprised of a plurality of memory circuits configured to perform a particular function, such as a cache memory, storage buffer, and the like. To reduce die area for implementing a memory system on an integrated circuit, such as an SOC, ones of the plurality of memory circuits may be abutted as close to possible to an adjacent memory circuit. Repeater circuits may be included within the memory circuits to allow signals to pass to and from an adjacent memory circuit, thereby enabling the adjacent memory circuits to be placed as close as possible. This adjacent placement also allows the some of the logic circuitry for accessing multiple ones of memory circuits to be shared there by conserving the area further.

Furthermore, in some embodiments, reduced power modes may be implemented that allow one or more of the plurality of memory circuits to be placed into a reduced power or even powered-down mode. In a memory system that includes circuitry sharing and/or adjacent placement of memory circuits along with reduced power modes, power states of memory circuits that include repeater circuits may be limited in what types of power states they may enter, or may be prevented from entering a low power state at all while an adjacent memory circuit of the memory system remains active.

BRIEF DESCRIPTION OF THE DRAWINGS

The following detailed description makes reference to the accompanying drawings, which are now briefly described.

FIG. 6 depicts a flow diagram of an embodiment of a method for accessing a second memory circuit via a first memory circuit that is in a reduced power state.

Figure 1:
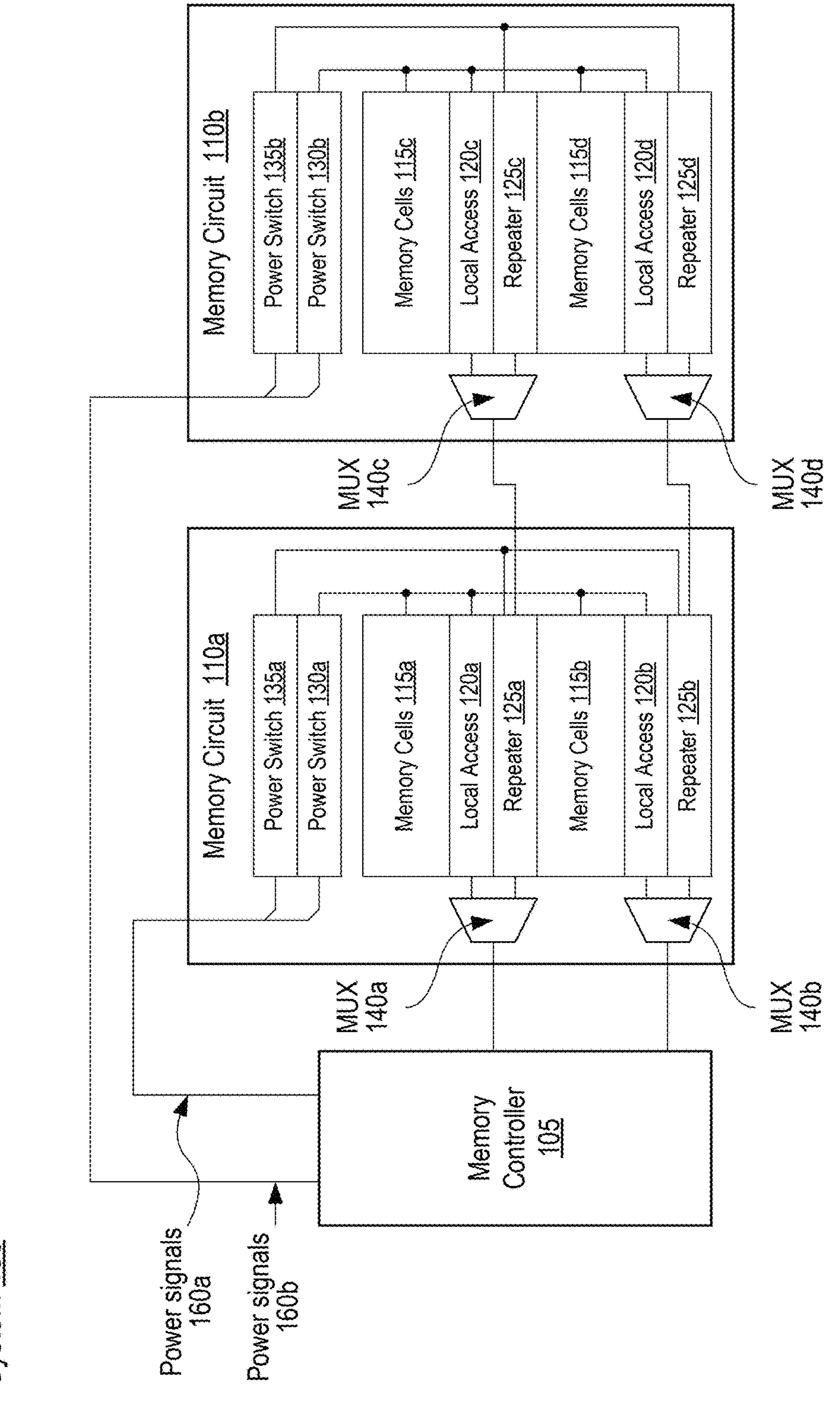
FIG. 1 illustrates a block diagram of an embodiment of a memory system that includes a plurality of memory circuits.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

When a memory system is included in a computer system, the memory system may be comprised of one or more instances of a particular memory circuit design. For example, to create a one megabyte cache memory system, a memory circuit design that includes 256 kilobytes (KB) of memory may be repeated four times with little to no changes to the design. As described above, one technique for reducing die area includes abutting the four instances of the 256 KB memory circuit next to one another such that a memory controller associated with the cache memory system uses a same external row decoder circuit to access corresponding rows in each of the memory circuits. A most significant portion of an address may be used by the external row decoder logic in the memory controller to select a single one (or in some embodiments, more than one) memory circuit. One or more less significant bits of the address may then be used (e.g., by local row decoder circuits in the memory circuits) to select a given set of rows to be read.

In other embodiments, a most significant portion of an address may be used by the external row decoder logic in the memory controller to identify a given set of rows in all four memory circuits. One or more less significant bits of the address may then be used (e.g., by local row decoder circuits in the memory circuits) to select a single one (or in some embodiments, more than one) memory circuit. A given row of the selected memory circuit may then be read.

In various embodiments, a memory system may be implemented entirely in a single integrated circuit (IC) such as a system-on-chip (SOC), or as a plurality of ICs coupled together one or more circuit boards. In some embodiments, a given memory circuit may include a plurality of memory banks in which each bank may be accessed and/or powered individually.

As described above, some computer systems have the ability to reduce power and/or power down one or more memory banks to save power in a particular memory system. When all banks in a given memory circuit (e.g., four banks per memory circuit) are powered down, power may be maintained to the periphery logic of the given memory circuit (e.g., local row decoders, drivers, etc.) in order to use embedded repeater circuits for transferring data coming from or going to other memory circuits in the memory system. For example, two memory circuits might be physically abutted such that access by the memory controller's row decoder logic to a memory circuit farther from the memory controller is accomplished via repeater circuits in a memory circuit that is nearer to the memory controller. If the near memory circuit is powered down, then periphery logic in the near memory circuit remains powered in order to transmit data from the far memory circuit.

To increase a number of circuits that may be powered down in a given memory circuit, a separate power signal may be provided only for repeater circuits included in the periphery logic. Such a technique may allow the memory circuit to power down completely, except for the required repeater circuits. Accordingly, power may be saved that would otherwise be consumed in the entire periphery logic. Additionally, some memory circuits may not use the repeater pins at all, such as a farthest memory circuit from the memory controller. Repeater circuits in such a farthest memory circuit may be permanently powered down. It is noted that in various embodiments, repeater circuits may be bidirectional (e.g., used for reading and writing data), or may be unidirectional, with one set of repeater circuits used to read data and a separate set of repeater circuits used to write data. In the latter embodiments, separate power signals may be used to individually power read and/or write repeater circuits.

Accordingly, a memory system management technique is contemplated in which a memory circuit may include repeater circuits for accessing an adjacent memory circuit as well as local access circuits for accessing memory cells within the memory circuit. In an example embodiment, a first memory circuit is coupled to a memory controller circuit and a second memory circuit. The first memory circuit may include a plurality of first memory cells, first local access circuitry, and a first set of repeater circuits. The second memory circuit may be coupled to the first set of repeater circuits and include a plurality of second memory cells and second local access circuitry. The memory controller circuit may be configured to place the first memory circuit into a reduced power state and then access the second memory circuit via the first set of repeater circuits.

FIG. 1 illustrates a block diagram of an embodiment of a system, such as a system-on-chip (SOC). As illustrated, system 100 includes memory controller 105 and memory circuits 110*a* and 110*b* (collectively 110). Each of memory circuits 110 include two respective sets of memory cells 115, two respective local access circuits 120, two respective repeater circuits 125, respective ones of power switches 130 and 135, and two respective multiplexor circuits (MUXs) 140. System 100 may be, in various embodiments, a single IC (e.g., an SOC), a plurality of ICs co-packaged as a single chip (e.g., a plurality of ICs coupled internal to the package to function as a single SOC), or a plurality of packaged ICs coupled to one another via one or more circuit boards.

As illustrated, memory controller 105 may be configured to access (e.g., read and write information) memory circuits 110. In various embodiments, memory circuits 110 may be part of a system memory used to store program instructions and/or associated data, a cache memory used to store recently used program instructions and/or associated data, a data buffer for storing tables, queues, or other types of data structures, and other similar data storage uses. In addition to accessing memory circuits 110, memory controller 105 may also control power control signals 160*a* and 160*b* (collectively 160) to control power switches 130*a*, 130*b*, 135*a* and 135*b*, thereby placing each of memory circuits into a selected one of a plurality of power states. As an example, system 100 may be a cache memory system configured to support a plurality of ways and cache lines. Memory controller may also be configured to consolidate cached information into one of memory circuits 110, thereby allowing the other one of memory circuits 110 to be placed into a reduced power state using power control signals 160*a* or 160*b*.

To reduce a size of control logic (e.g., address decoders, row drivers, and the like), memory controller 105 may be configured to access memory circuit 110*b* via repeater circuits 125*a* and 125*b*. In some embodiments, one or more additional memory circuits may be coupled memory circuit 110*b* via repeater circuits 125*c* and 125*d*. In various embodiments, any suitable number of memory circuits may be coupled via respective sets of repeater circuits, such that memory controller 105 may access any particular memory circuit without additional (or with limited additional) address decoders and/or row driver circuits.

As shown, memory circuit 110*a* is coupled to memory controller 105. Memory circuit 110*a* includes memory cells 115*a* and 115*b*, local access circuits 120*a* and 120*b*, and repeater circuits 125*a* and 125*b*. Memory circuit 110*b* is coupled to repeater circuits 125*a* and 125*b*, and includes memory cells 115*c* and 115*d*, as well and local access circuits 120*c* and 120*d*. In some embodiments as shown, memory circuit 110*b* may also include repeater circuits 125*c* and 125*d*. If system 100 does not include additional memory circuits coupled to repeater circuits 125*c* and 125*d*, then repeater circuits 125*c* and 125*d* may be hard-wired in a power-down state. For example, a given power signal included in power control signals 160*b* and coupled to power switch 135*b* may be tied to a logic low (or logic high, as appropriate) thereby preventing power switch 135*b* from transferring power to repeater circuits 125*c* and 125*d*. Such a configuration may allow a same memory circuit design to be used for both of memory circuits 110 as well as any additional memory circuits that may be accessed via memory controller 105.

In response to an indication to place memory circuit 110*a* into a reduced power state (e.g., power states in which stored data is not retained), memory controller 105 may move valid information stored in memory cells 115*a* and 115*b* into memory cells 115*c* and 115*d* of memory circuit 110*b*, or to another suitable storage location. After the valid information stored in memory circuit 110*a* has been copied elsewhere, memory controller 105 may set power control signals 160*a* to suitable values for placing memory circuit 110*a* into the desired power state. In response to the settings of power control signals 160*a*, memory circuit 110*a* may be configured to power down memory cells 115*a* and 115*b* and local access circuits 120*a* and 120*b*. Memory circuit 110*a* may also be configured to retain power to repeater circuits 125*a* and 125*b*. For example, power control signals 160*a* may include two or more control signals, a first coupled to power switch 130*a* and a second coupled to power switch 135*a*. The first power signal may cause power switch 130*a* to decouple power from memory cells 115*a* and 115*b* and local access circuits 120*a* and 120*b*, while the second power signal may cause power switch 135*a* to maintain power to repeater circuits 125*a* and 125*b*.

Memory circuit 110*a*, as illustrated, may also be configured to access memory circuit 110*b* via repeater circuits 125*a* and 125*b*. Repeater circuits 125*a* and 125*b* are coupled to local access circuits 120*c* and 120*d*, and may be configured to receive information read by local access circuits 120*c* and 120*d* from memory cells 115*c* and 115*d*, and relay the received information to the memory controller circuit. As shown, memory controller 105 may cause MUXs 140*a* and 140*b* to select, respectively, repeater circuits 125*a* and 125*b* as inputs rather than local access circuits 120*a* and 120*b*. In contrast, memory controller 105 may cause MUXs 140*c* and 140*d* to select, respectively, local access circuits 120*c* and 120*d* as inputs rather than repeater circuits 125*c* and 125*d*. Although memory controller 105 is described as causing MUXs 140 to select a particular input, memory circuits 110*a* and 110*b* may include the appropriate circuits for setting respective MUXs 140 to the desired inputs.

Such a technique for maintaining power to repeater circuits of a first memory circuit while placing circuits for storing and accessing information in the first memory circuit into reduced power states may allow a second memory circuit to be accessed via the repeater circuits in the first memory circuit. This technique enables a given memory system to be designed in a manner that supports use of reduced access circuitry (e.g., row drivers, address decoders, etc.) while preserving a capability to place any one or more of the memory circuits into a reduced power state without blocking access to memory circuits that remain in a functional power state.

It is noted that system 100, as illustrated in FIG. 1, is merely an example. The illustration of FIG. 1 has been simplified to highlight features relevant to this disclosure. Various embodiments may include different configurations of the circuit elements. For example, two memory circuits are shown. In other embodiments, any suitable number of memory circuits may be included. Furthermore, other circuits commonly included in SOCs may be included in other embodiments, such as processor cores, various peripherals, communication fabrics, power and clock management circuits, and the like. In various embodiments, circuits of system 100, such as memory controller 105, MUXs 140, local access circuits 120, repeater circuits 125, etc., may be implemented using any suitable combination of sequential and combinatorial logic circuits. In addition, register and/or memory circuits, such as SRAM, may be used in memory circuits 110 and other circuits to temporarily hold information such as instructions, data, address values, system configurations, and the like.

Figure 2:
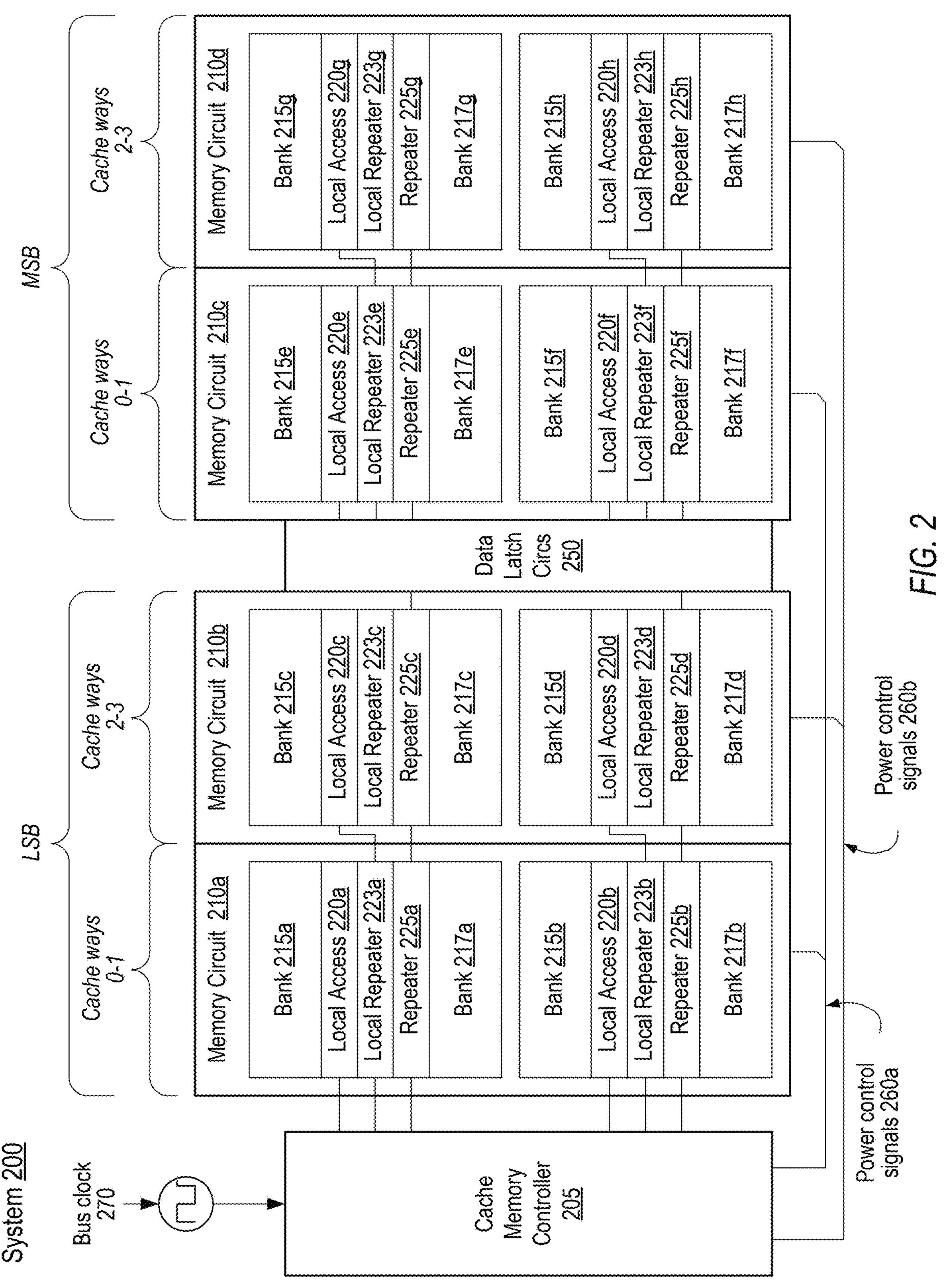
FIG. 2 shows a block diagram of an embodiment of a cache memory system that includes a plurality of memory circuits.

FIG. 1 depicts use of a memory controller to access two memory circuits that share at least some access circuitry. Such memory systems may be implemented in a variety of manners. FIG. 2 illustrates an example of a system that includes four memory circuits configured for use as a cache memory.

Moving to FIG. 2, a block diagram an embodiment of a cache memory system with four memory circuits is illustrated. System 200 includes cache memory controller 205, and memory circuits 210_a_-210_d_ (collectively 210). Each of memory circuits 210 include four respective memory banks, two each from banks 215_a_-215_h_ and two each from banks 217_a_-217_h_. In addition, each of memory circuits 210 includes two respective local repeater circuits 223 and two respective repeater circuits 225. In a similar manner as system 100 in FIG. 1, cache memory system 200 may be implemented, in various embodiments, on a single IC (e.g., an SOC), a plurality of ICs co-packaged as a single chip (e.g., a plurality of ICs coupled internal to the package to function as a single SOC), or a plurality of packaged ICs coupled to one another via one or more circuit boards. Although a cache memory system is used in the present example, system 200 may be used as any suitable type of memory system in other embodiments.

As illustrated, memory circuits 210 combine to form four cache ways for cache memory system 200. Memory circuits 210_a_ and 210_b_ store least significant bytes (LSBs) for stored cache lines while memory circuits 210_c_ and 210_d_ store respective most significant bytes (MSBs). When cache memory controller 205 reads a cache line for either way 0 or way 1, an LSB portion is read from memory circuit 210_a_ and an MSB portion is read from memory circuit 210_c_. Similarly, when cache memory controller 205 reads a cache line for either way 2 or way 3, an LSB portion is read from memory circuit 210_b_ and an MSB portion is read from memory circuit 210_d_. The combination of the LSB and MSB reads for a given cache line may occur in parallel in a same cycle of bus clock 270, or consecutively in successive cycles of bus clock 270. Each of the LSB and MSB portions may include any suitable number of bits of information.

Memory circuits 210_a_ and 210_c_, as shown, include respective sets of repeater circuits, repeater circuits 225_a_ and 225_b_ in memory circuit 210_a_ and repeater circuits 225_e_ and 225_f_ in memory circuit 210_c_. Furthermore, memory circuits 210_a_ and 210_c_ also include respective sets of local repeater circuits, local repeater circuits 223_a_ and 223_b_ in memory circuit 210_a_ and local repeater circuits 223_e_ and 223_f_ in memory circuit 210_c_. In the present embodiment, local repeater circuits 223 are used to access an adjacent memory circuit while repeater circuits 225 are used to access memory circuits that are farther away. For example, local repeater circuit 223_a_ may be used to access information stored in memory circuit 210_b_ while repeater circuit 225_a_ is used to access information stored in memory circuits 210_c_ and 210_d_. In other embodiments, local repeater circuits 223 may be omitted and repeater circuits 225 may be used to access all other memory circuits 210.

Memory circuits 210_a_ and 210_c_ may also be coupled to power control signals 260_a_. While a single line is illustrated to each memory circuit 210, multiple signal lines may be coupled to each memory circuit to individually control a plurality of power switches, similar to the description above for FIG. 1. While omitted for clarity, memory circuits 210_a_ and 210_c_ may further include respective sets of local access circuitry for accessing memory cells within banks 215_a_, 215_b_, 217_a_, and 217_b_ in memory circuit 210_a_, and banks 215_e_, 215_f_, 217_e_, and 217_f_ in memory circuit 210_c_. In some embodiments, each of memory circuits 210 may include respective MUXs for selecting between local repeater circuits 223, repeater circuits 225 and local access circuits 220. In such embodiments, a first set of MUXs may be included in each memory circuit 210 to select between local access circuits 220 and local repeater circuits 223 while a second set of MUXs may be included external to memory circuits 210 and used to select between the first set of MUXs and repeater circuits 225. In other embodiments, indicators of a memory request address may be sent to each of memory circuits 210 and the respective sets of local access circuitry may be used to select a given memory row or rows.

Memory circuits 210_b_ and 210_d_ may be configured in a similar manner as memory circuits 210_a_ and 210_c_. Accordingly, memory circuits 210_b_ and 210_d_ may include respective sets of repeater circuits 225, local repeater circuits 223 and coupled to a second subset of the plurality of power control signals. Additionally, memory circuits 210_b_ and 210_d_ may further include respective sets of local access circuitry for accessing memory cells within banks 215_c_, 215_d_, 217_c_, and 217_d_ in memory circuit 210_b_, and banks 215_g_, 215_h_, 217_g_, and 217_h_ in memory circuit 210_d_, as well as respective MUXs for selecting between local repeater circuits 223, repeater circuits 225 and local access circuits 220.

System 200 also includes a set of data latch circuits 250 coupled between repeater circuits 225_c_ and 225_d_ of memory circuit 210_b_ and local access circuits 220_e_ and 220_f_, local repeater circuits 223_e_ and 223_f_, and repeater circuits 225_e_ and 225_f_ of memory circuit 210_c_. Data latch circuits 250 may be configured to latch information read from memory circuits 210_c_ and 210_d_ to be forwarded to cache memory controller 205 via repeater circuits 225_a_-225_d_. In some embodiments, memory circuits 210 may be repeated instances of a common memory circuit design. This common memory circuit design may be configured to use the respective set of local repeater circuits 223 to couple banks 215 and 217 of an adjacent memory circuit 210 that is on a same side of data latch circuits 250 to cache memory controller 205, and use repeater circuits 225 to couple banks 215 and 217 of a memory circuit 210 on the other side of data latch circuits 250 to cache memory controller 205. For example, memory circuit 210*a* may be configured to use local repeater circuits 223*a* and 223*b* to access banks 215*c*, 215*d*, 217*c*, and 217*d* in memory circuit 210*b*. Both memory circuits 210*a* and 210*b* may be configured to use repeater circuits 225*a*-225*d* to access banks 215*e*-215*h* and 217*e*-217*h* in memory circuits 210*c* and 210*d*.

As illustrated, cache memory controller 205 is coupled to memory circuit 210*a*. During operation of system 200, cache memory controller 205 may, based on a current operating mode and/or number of valid cache lines, be configured to consolidate valid cache lines into either cache ways 0-1 (e.g., memory circuits 210*a* and 210*c*) or in cache ways 2-3 (memory circuits 210*b* and 210*d*). If, for example, all valid cache lines are stored in cache ways 0-1, then cache memory controller 205 may be configured to de-assert a portion of power control signals 260*b* which include power control signals for memory cells in memory circuits 210*b* and 210*d* (e.g., banks 215*c*, 215*d*, 217*c*, 217*d*, 215*g*, 215*h*, 217*g*, and 217*h*). This portion of power control signals 260*b* may further include power control signals for local repeater circuits 223*c*, 223*d*, 223*g*, and 223*h*, as well as local access circuitry in memory circuits 210*b* and 210*d*. A different portion of power control signals 260*b* may remain asserted to maintain power to repeater circuits 225*c*, 225*d*, 225*g*, and 225*h*. In other embodiments, repeater circuits 225*g* and 225*h*, as well as local repeater circuits 223*g* and 223*h*, may be permanently powered down if memory circuit 210*d* is not coupled to another memory circuit other than memory circuit 210*c*.

In a manner as described above, maintaining power to repeater circuits 225*c* and 225*d* may enable cache memory controller 205 to access the MSBs of cache lines stored in memory circuit 210*c* while memory circuits 210*b* and 210*d* are in a reduced power state (e.g., powered down). Including repeater circuits 225 within a common memory circuit design used for all of memory circuits 210 may provide a desired level of efficiency for circuit size and power management while also allowing any desired number of memory circuits to be included in system 200 without needing a separate memory circuit design and/or requiring modifications to the common design.

It is noted that the embodiment of FIG. 2 is one example of how a cache memory system may be implemented with support for temporarily powering down portions of the memory circuits without blocking access to memory circuits that remain powered. Similar to FIG. 1, elements included in FIG. 2 are limited for clarity. In other embodiments, the memory circuits may include additional elements, such as described above, local access circuits and MUX circuits, as well as local row decoder logic, column drivers, and the like. In various embodiments, circuits of system 200 may be implemented using any suitable combination of sequential and combinatorial logic circuits, SRAM and/or DRAM memory circuits, and the like.

Figure 3:
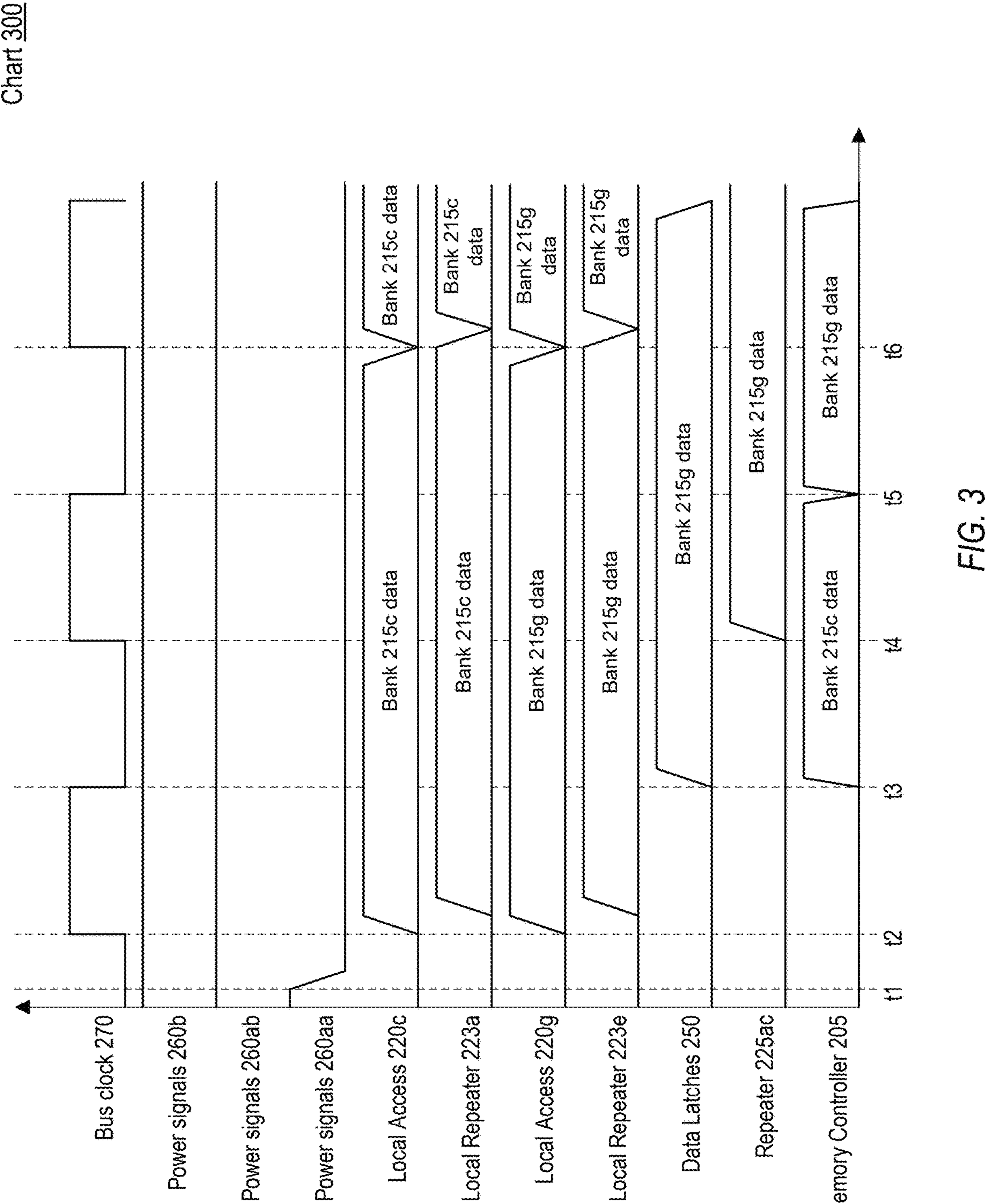
FIG. 3 depicts a chart of various signals that may be associated with operation of an embodiment of the cache memory system of FIG. 2.

In the description of FIG. 2, an MSB portion of a given cache line is described as being read in parallel with or consecutively to a corresponding LSB portion of the given cache line. In FIG. 3, an example timing diagram is illustrated for a case in which the MSB portion is read consecutive to the LSB portion.

Turning to FIG. 3, a timing diagram is depicted for performing a cache line read in an embodiment of system 200 in FIG. 2. Chart 300 includes depictions of signals related to elements of system 200. References to elements in FIG. 2 are included as non-limiting examples. Bus clock 270 depicts a bus clock signal that provides timing for system 200. Power control signals 260*aa*, 260*ab*, and 260*b* corresponds to signals generated by cache memory controller 205 to control various power switches in memory circuits 210. Local access circuits 220*c* and 220*g* depict data accessed by the corresponding local access circuits 220*c* and 220*g* from banks 215*c* and 215*g*, respectively. Local repeater circuits 223*a* and 223*e* illustrate data received local access circuits 220*c* and 220*g*, respectively. Data latch circuits 250 depicts data captured by data latch circuits 250. Repeater 225*ac* corresponds to data received on repeater circuits 225*a* and 225*c* from data latch circuits 250. Cache memory controller 205 shows data received by cache memory controller 205 via memory circuit 210*a*.

As illustrated prior to time t1, power control signals 260*aa*, 260*ab* and 260*b* are all asserted, indicating that all of memory circuits 210 are powered and may be fully operational. At time t1, cache memory controller 205 places system 200 into a reduced power mode in which cache ways 0-1 are placed into a power-down state while cache ways 2-3 remain powered and active. To enter this reduced power state, cache memory controller 205 keeps power control signals 260*b* asserted to maintain power to memory circuits 210*b* and 210*d*. Cache memory controller 205 also keeps power control signals 260*ab* asserted to maintain power to local repeater circuits 223*a*, 223*b*, 223*e*, and 223*f*, to repeater circuits 225*a*, 225*b*, 225*e*, and 225*f*, as well as to respective local row decoder logic circuits of memory circuits 210*a* and 210*c*. To power down circuits in memory circuits 210*a* and 210*c* that are not needed for accessing memory circuits 210*b* and 210*d*, cache memory controller 205 de-asserts power control signals 260*aa*. The de-assertion of power control signals 260*aa* may disable power to banks 215 and 217, to local access circuits 220, and to the respective local row decoder logic circuits in memory circuits 210*a* and 210*c*.

To access LSB cache line information stored in memory circuit 210*b* (e.g., bank 215*c* data), local access circuit 220*c* accesses, at a rising transition of a first cycle of bus clock 270 at time t2, data from bank 215*c* of memory circuit 210*b*. After a propagation delay, local repeater circuit 223*a* receives bank 215*c* data from local access circuit 220*c*. In the present example, cache memory controller 205 is configured to capture bank 215*c* data from local repeater circuit 223*a* at a subsequent falling transition (time t3) of bus clock 270.

To access MSB cache line information stored in memory circuit 210*d* (e.g., bank 215*g* data), local access circuit 220*g* accesses, at a rising transition of the first cycle of bus clock 270 at time t2, data from bank 215*g* of memory circuit 210*d*. After a similar propagation delay, local repeater circuit 223*e* receives bank 215*g* data from local access circuit 220*g*. Data latch circuits 250 are configured to store, at the subsequent falling transition of bus clock 270 at time t3, bank 215*g* data from local repeater circuit 223*e*.

Repeater circuits 225*a* and 225*c* are configured to access, at rising transition of a second cycle of bus clock 270 that is subsequent to the first cycle (time t4), bank 215*g* data from the data latch circuits 250. At a subsequent falling transition of bus clock 270 at time t5, cache memory controller 205 is configured to capture bank 215*g* data from repeater circuit 225*a*. At the next rising transition of bus clock 270 at time t6, a subsequent read of a different cache line may begin.

It is noted that chart 300 of FIG. 3 is merely an example of signals associated with operation of the cache memory system depicted in FIG. 2. Signals are depicted as logic values for clarity, in actual circuits, the represented signals may include voltage variations due to power signal fluctuations, signal cross-talk from adjacent circuits in an SOC, and other such sources of signal noise. Additional signals may be included in other embodiments, such as address information sent to row decoder logic, column driver signals associated with memory circuit sense amps, and the like.

To summarize, various embodiments of an apparatus may include a memory controller circuit, and a first memory circuit coupled to the memory controller circuit. The first memory circuit may include a plurality of first memory cells, first local access circuitry, and a first set of repeater circuits. The apparatus may further include a second memory circuit coupled to the first set of repeater circuits. The second memory circuit may include a plurality of second memory cells and second local access circuitry. The memory controller circuit may be configured to place the first memory circuit into a reduced power state and access the second memory circuit via the first set of repeater circuits.

In a further example, the first memory circuit may be configured to power down the plurality of first memory cells and the first local access circuitry, and to retain power to the first set of repeater circuits. In another example, the first set of repeater circuits is coupled to the second local access circuitry and is configured to receive information read by the second local access circuitry from the second memory circuit, and to relay the received information to the memory controller circuit.

In an example, the apparatus may further comprise a third memory circuit coupled to a second set of repeater circuits included in the second memory circuit. The third memory circuit may include a plurality of third memory cells, third local access circuitry, and a third set of repeater circuits. The apparatus may further comprise a fourth memory circuit coupled to the third set of repeater circuits. The fourth memory circuit may include a plurality of fourth memory cells and fourth local access circuitry.

In a further example, the memory controller circuit may be further configured to place the second and fourth memory circuits into the reduced power state. The memory controller circuit may be further configured to access, in a first bus cycle, the first memory circuit via the first local access circuitry, and to access, in a second bus cycle, the third memory circuit via the first and second sets of repeater circuits.

In an example, the first and second memory circuits may be respective instances of a common memory circuit design that correspond to least-significant bytes (LSB) of cache lines and the third and fourth memory circuits are respective additional instances of the common memory circuit design that correspond to most-significant bytes (MSB) of the cache lines. In a further example, the common memory circuit design may include a respective set of repeater circuits, a respective set of local repeater circuits, and a respective plurality of memory banks. The common memory circuit design may be configured to use the respective set of local repeater circuits to couple one or more memory banks of the respective plurality of memory banks to the memory controller circuit, and to use the respective set of repeater circuits to couple one or more adjacent memory circuits to the memory controller circuit.

In another example, the apparatus may further include a plurality of data latch circuits coupled between the second and third memory circuits. The plurality of data latch circuits may be configured to latch information read from the third and fourth memory circuits. In an example, the second memory circuit may include a second set of repeater circuits, wherein the second set of repeater circuits are hard-wired in a power-down state.

The circuits and techniques described above in regards to FIGS. 1-3 may manage power and access data using a variety of methods. Several methods associated with operation of a memory system are described below in combination with FIGS. 4-6. In some embodiments, the operations of the disclosed methods may be performed using instructions included in a non-transient, computer-readable memory having program instructions being executable by processor circuits in the systems to cause the operations described with reference to FIGS. 4-6.

Figure 4:
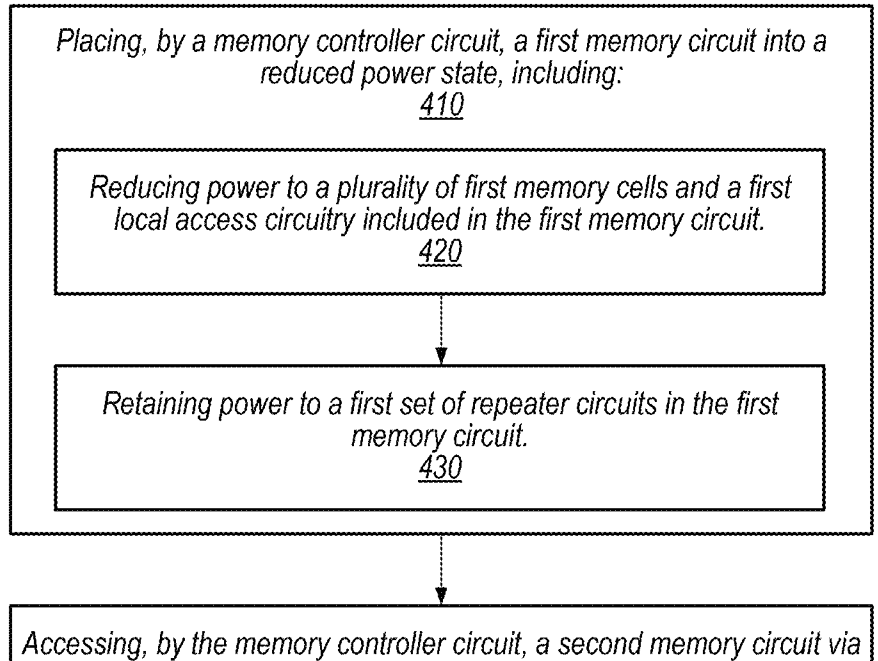
FIG. 4 illustrates a flow diagram of an embodiment of a method for operating a memory system with a plurality of memory circuits.

Moving now to FIG. 4, a flow diagram for an embodiment of a method for managing power in a memory system is illustrated. Method 400 may be performed by a system, such as systems 100 and 200 in FIGS. 1 and 2. Method 400 is described below using system 100 of FIG. 1 as an example. References to elements in FIG. 1 are included as non-limiting examples.

Method 400 begins in block 410 with a memory controller circuit placing a first memory circuit into a reduced power state. For example, memory controller 105 may be configured to place memory circuit 110*a* into a reduced power state, such as a power-down state. Memory circuits 110*a* and 110*b* may be used to store any suitable information. The configuration of memory circuits 110*a* and 110*b* may reduce an amount of circuitry required to access each memory circuit 110 as well as reduce an amount of physical area needed to implement both memory circuits 110 onto a same IC or multiple ICs onto a same circuit board. This configuration, as described above, may result in circuits in memory circuit 110*a* being used to access information stored in memory circuit 110*b*. Under particular conditions, one of memory circuits 110 may be capable of being placed into the reduced power state to reduce power consumption while the other memory circuit 110 remains active to support storage of information. To place memory circuit 110*a* into the reduced power state, operations of blocks 420 and 430 are performed.

At block 420, method 400 continues with reducing power to a plurality of first memory cells and a first set of local access circuits included in the first memory circuit. To reduce power to memory circuit 110*a*, memory controller 105 may be configured to set power control signals 160*a* to disable power switch 130*a*, thereby removing a power source to memory cells 115*a* and 115*b* as well as to local access circuits 120*a* and 120*b*.

Method 400, at block 430, proceeds with retaining power to a first set of repeater circuits in the first memory circuit. To maintain access to information stored in memory circuit 110*b*, memory controller 105 may be configured to set power control signals 160*a* to keep power switch 135*a* enabled, thereby maintaining a power source to repeater circuits 125*a* and 125*b*. As shown in FIG. 1, memory circuit 110*a* further includes MUXs 140*a* and 140*b* that are each coupled to a respective one of local access circuits 120*a* and 120*b* and to a respective one of repeater circuits 125*a* and 125*b*. Power switch 135*a* may further provide the power source to MUXs 140*a* and 140*b*.

Method 400 continues at block 440 with accessing, by the memory controller circuit, a second memory circuit via the first set of repeater circuits. For example, with power switch 130*a* disabled and power switch 135*a* enabled, power is maintained to repeater circuits 125*a* and 125*b* while memory cells 115*a* and 115*b* and local access circuits 120*a* and 120*b* are powered down to conserve power. Memory controller

105 is configured to access memory cells 115*c* and 115*d* of memory circuit 110*b* via repeater circuits 125*a* and 125*b*. MUXs 140*a* and 140*b* may be configured to select inputs connected to repeater circuits 125*a* and 125*b* while power switch 130*a* in the reduced power state.

By maintaining power only to repeater circuits used to access memory circuit 110*b* and the associated circuits coupling these repeater circuits to memory controller 105, a significant portion of memory circuit 110*a* may be powered down to conserve power while access remains to other memory circuits coupled to memory controller 105 via memory circuit 110*a*. Such a technique may enable an efficient placement of memory circuits within system 100 that reduces a size of system 100.

It is noted that the method of FIG. 4 includes blocks 410-440. Method 400 may end in block 440, or may repeat some or all operations. For example, method 400 may repeat block 440 to make a plurality of accesses to memory circuit 110*b* while memory circuit 110*a* is in the reduced power state. Additionally, method 400 may be performed concurrently with a different instance of method 400. For example, two or more instances of method 400 may be performed concurrently in system 200 of FIG. 2 to place two or more of memory circuits 210 into reduced power states.

Figure 5:
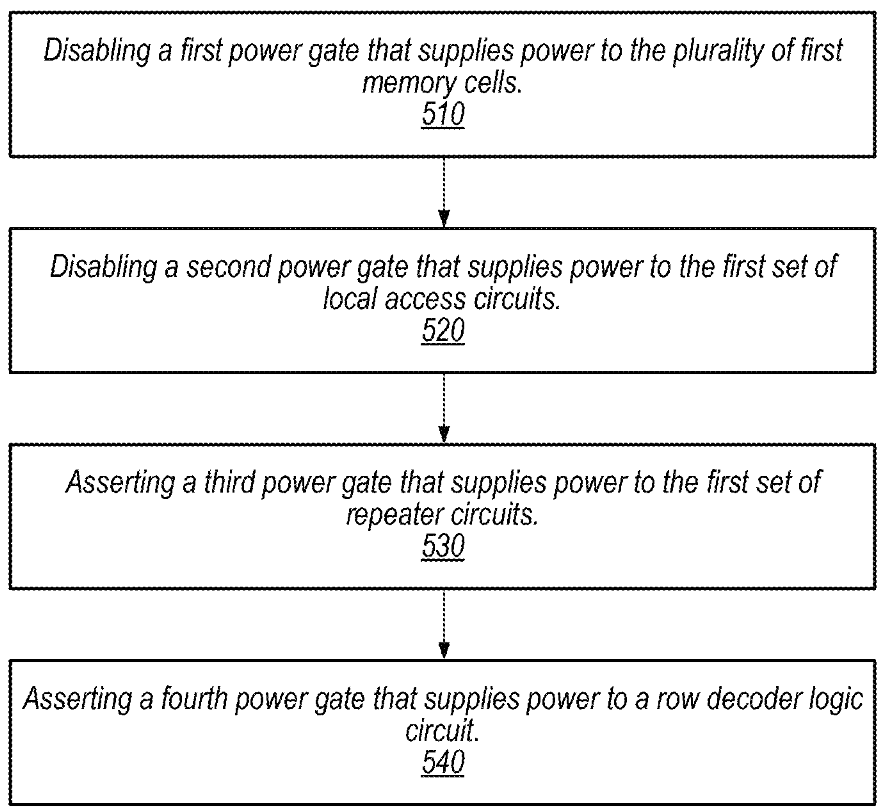
FIG. 5 shows a flow diagram of an embodiment of a method for disabling power to a given memory circuit in a memory system with a plurality of memory circuits.

Turning now to FIG. 5, a flow diagram for an embodiment of a method for powering down a memory circuit in a memory system is illustrated. In a manner similar to method 400, method 500 may be performed by a system, such as systems 100 and 200 in FIGS. 1 and 2. Method 500 is described below using system 100 of FIG. 1 as an example. References to elements in FIG. 1 are included as non-limiting examples. Method 500 may be performed as a part of one or more operations of method 400, such as blocks 420 and 430.

At block 510, method 500 begins by disabling a first power gate that supplies power to the plurality of first memory cells. For example, power switches 130*a* and 135*a* in FIG. 1 may each include one or more switch circuits that are configured to couple a respective circuit to a power rail. In some embodiments, a given power switch may include one or more metal-oxide-silicon field effect transistors (MOSFETs) in which a drain terminal is coupled to the power rail, a source terminal is coupled to the respective circuit, and a gate terminal is coupled to a power signal that is used to enable (allow or disable (block) current flow from the drain terminal to the source terminal. Power control signals 160*a* may, therefore, include one or more signals that enable or disable each of the one or more MOSFETs included in power switches 130*a* and 135*a*. Accordingly, a first set of MOSFETs in power switches 130*a* may be coupled between a power rail and memory cells 115*a* and 115*b*. A first subset of power control signals 160*a* are set to disable these one or more MOSFETs coupled to memory cells 115*a* and 115*b*, thereby powering down memory cells 115*a* and 115*b*.

Method 500 continues at block 520 by disabling a second power gate that supplies power to the first set of local access circuits. In a similar manner as in block 510, a second set of MOSFETs in power switches 130*a* may be coupled between the power rail and local access circuits 120*a* and 120*b*. The first subset of power control signals 160*a* may further include signals set to disable these one or more MOSFETs coupled to local access circuits 120*a* and 120*b*, thereby powering down local access circuits 120*a* and 120*b*.

At block 530, method 500 continues by asserting a third power gate that supplies power to the first set of repeater circuits. For example, a third set of MOSFETs may be included in power switches 135*a* and be coupled between the power rail and repeater circuits 125*a* and 125*b*. A second subset of power control signals 160*a* may then be set to enable the third set of MOSFETs, thereby providing power to repeater circuits 125*a* and 125*b*.

Method 500 proceeds to block 540 by asserting a fourth power gate that supplies power to a local row decoder logic circuit. In a similar manner as in block 530, a fourth set of MOSFETs may, in some embodiments, be included in power switches 135*a* and be coupled between the power rail and MUXs 140*a* and 140*b*, as well as to any additional logic used for addressing particular ones of memory cells 115*c* and 115*d* in memory circuit 110*b* (e.g., local row decoder logic). The second subset of power control signals 160*a* may further include signals set to enable the fourth set of MOSFETs, thereby providing power to MUXs 140*a* and 140*b* and to the additional addressing logic. In other embodiments, as described above, indicators of a memory request address may be sent to each of memory circuits 210 and the respective sets of local access circuitry may be used to select a given memory row or rows.

It is noted that the method of FIG. 5 includes blocks 510-540. Method 500 may end in block 540, or may repeat some or all operations. Method 500, similar to method 400, may be performed concurrently with a different instance of methods 400 and/or 500, for example, to power down a different memory circuit included in the memory system.

Proceeding now to FIG. 6, a flow diagram is illustrated for an embodiment of a method for accessing information stored in a second memory circuit via a first memory circuit that is in a reduced power state. In a similar manner to methods 400 and 500, method 600 may be performed by a system, such as systems 100 and 200 in FIGS. 1 and 2. Method 600 is described below using system 100 of FIG. 1 as an example. References to elements in FIG. 1 are included as non-limiting examples. In some embodiments, method 600 may be performed as a part of method 400, such as a part of block 440.

At block 610, method 600 begins by reading information from a portion of the second memory cells via a subset of the second set of local access circuits. To access the second memory circuit as described in method 400, the local row decoder logic described in block 540 of method 500 may be used to address a particular row of memory cells 115*c* and/or 115*d*. For example, if a particular address corresponds to locations in memory cells 115*d*, then local access circuit 120*d* may read these memory cells based on signals provided by the local row decoder logic of memory circuit 110*a*. MUX 140*d* is configured to select an output of local access circuit 120*d* as an active input for receiving the read information from local access circuit 120*d*.

Method 600 continues at block 620 by relaying the read information to the memory controller circuit via a subset of the first set of repeater circuits. Repeater circuit 125*b* may be configured to receive an output of MUX 140*d*, thereby receiving the read information from local access circuit 120*d*. Repeater circuit 125*b* may then pas the read information to MUX 140*b*. MUX 140*d*, in turn, is configured to select an output of repeater circuit 125 as an active input for receiving the read information. The output of MUX 140*d* provides the read information to memory controller 105.

It is noted that the method of FIG. 6 includes blocks 610-620. Method 600 may end in block 620, or may repeat some or all operations. For example, method 600 may repeat in response to reading a plurality of locations from memory circuit 110*b*. Method 600, similar to methods 400 and 500, may be performed concurrently with a different instance of any of methods 400-600. Although two blocks are illustrated for clarity, additional blocks may be included, such as receiving and decoding an address in memory circuit 110*b* to access.

Figure 7:
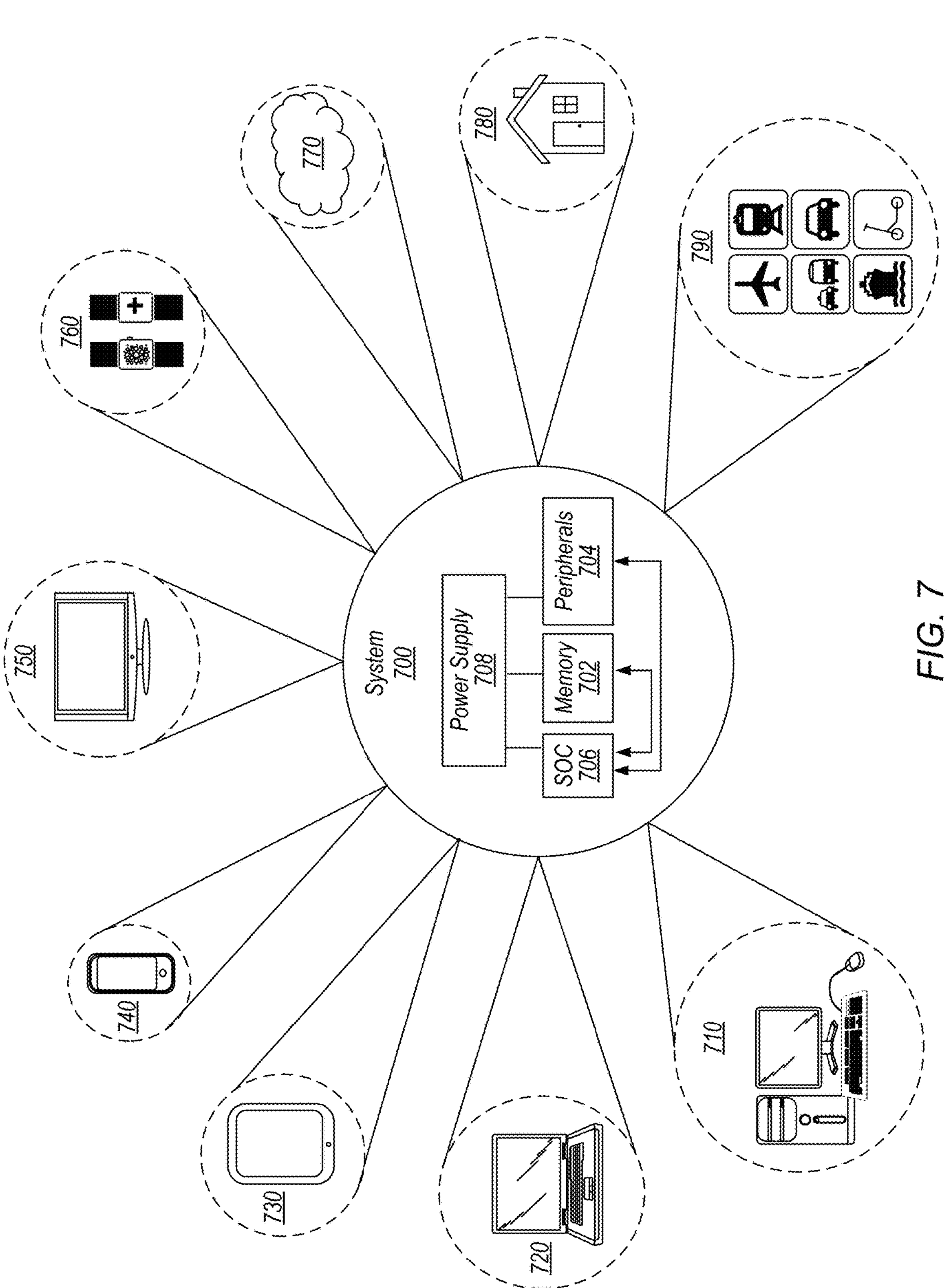
FIG. 7 illustrates various embodiments of systems that include coupled integrated circuits.

FIGS. 1-6 illustrate circuits and methods for managing power in a memory system that includes a plurality of memory circuits. The memory systems described herein may be included in a single IC, such as an SOC, or included in a plurality of ICs coupled together in a common package to perform as a single SOC, or as a plurality of packaged chips coupled together via a circuit board. Any embodiment of the disclosed systems may be included in one or more of a variety of computer systems, such as a desktop computer, laptop computer, smartphone, tablet, wearable device, and the like. A block diagram illustrating an embodiment of system 700 is illustrated in FIG. 7. System 700 may, in some embodiments, include any disclosed embodiment of systems disclosed herein, such as system 100 and 200 shown in FIGS. 1 and 2.

In the illustrated embodiment, the system 700 includes at least one instance of a system-on-chip (SOC) 706 which may include multiple types of processor circuits, such as a central processing unit (CPU), a graphics processing unit (GPU), or otherwise, a communication fabric, and interfaces to memories and input/output devices. SOC 706 may correspond to an instance of the systems disclosed herein. In various embodiments, SOC 706 is coupled to external memory circuit 702, peripherals 704, and power supply 708.

A power supply 708 is also provided which supplies the supply voltages to SOC 706 as well as one or more supply voltages to external memory circuit 702 and/or the peripherals 704. In various embodiments, power supply 708 represents a battery (e.g., a rechargeable battery in a smart phone, laptop or tablet computer, or other device). In some embodiments, more than one instance of SOC 706 and/or external memory circuit 702 may be included in system 700.

External memory circuit 702 is any type of memory, such as dynamic random-access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. In some embodiments, external memory circuit 702 may include non-volatile memory such as flash memory, ferroelectric random-access memory (FRAM), or magnetoresistive RAM (MRAM). One or more memory devices may be coupled onto a circuit board to form memory modules such as single inline memory modules (SIMMs), dual inline memory modules (DIMMs), etc. Alternatively, the devices may be mounted with a SOC or an integrated circuit in a chip-on-chip configuration, a package-on-package configuration, or a multi-chip module configuration.

In various embodiments, systems 100 and 200 may be included in SOC 706, in external memory circuit 702, or a combination thereof. For example, memory controller 105 may be included in SOC 706 while memory circuits 110*a* and 110*b* are included in external memory circuits 702.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multitouch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, the smartwatch may include a variety of general-purpose computing related functions. For example, the smartwatch may provide access to email, cellphone service, a user calendar, and so on. In various embodiments, a health monitoring device may be a dedicated medical device or otherwise include dedicated health related functionality. In various embodiments, the above-mentioned smartwatch may or may not include some or any health monitoring related functions. Other wearable devices 760 are contemplated as well, such as devices worn around the neck, devices attached to hats or other headgear, devices that are implantable in the human body, eyeglasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home 780 other than those previously mentioned. For example, appliances within the home may monitor and detect conditions that warrant attention. Various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation 790. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise.

It is noted that the wide variety of potential applications for system 700 may include a variety of performance, cost, and power consumption requirements. Accordingly, a scalable solution enabling use of one or more integrated circuits to provide a suitable combination of performance, cost, and power consumption may be beneficial. These and many other embodiments are possible and are contemplated. It is noted that the devices and applications illustrated in FIG. 7 are illustrative only and are not intended to be limiting. Other devices are possible and are contemplated.

As disclosed in regard to FIG. 7, system 700 may include one or more integrated circuits included within a personal computer, smart phone, tablet computer, or other type of computing device. A process for designing and producing an integrated circuit using design information is presented below in FIG. 8.

Figure 8:
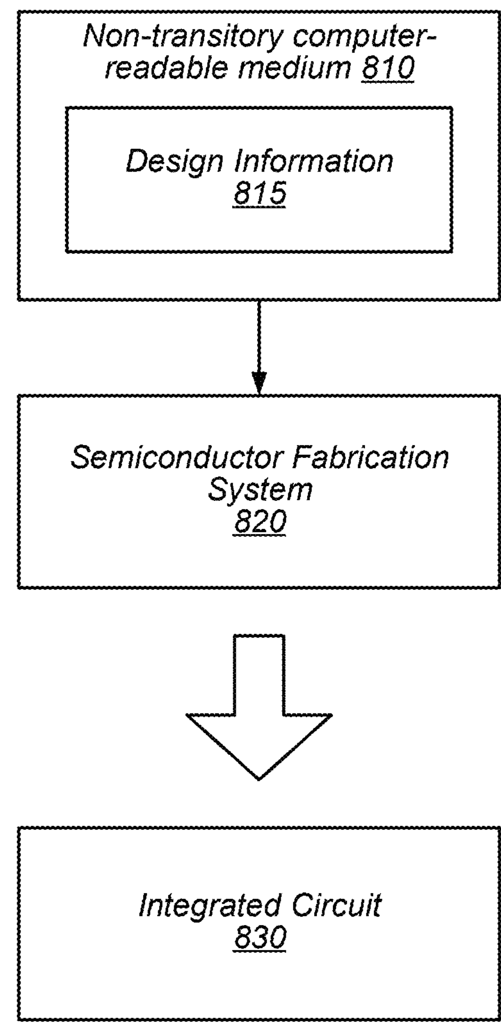
FIG. 8 shows a block diagram of an example computer-readable medium, according to some embodiments.

FIG. 8 is a block diagram illustrating an example of a non-transitory computer-readable storage medium that stores circuit design information, according to some embodiments. The embodiment of FIG. 8 may be utilized in a process to design and manufacture integrated circuits, for example, including one or more instances (or portions thereof) of systems 100 and 200 that are disclosed above. In the illustrated embodiment, semiconductor fabrication system 820 is configured to process the design information 815 stored on non-transitory computer-readable storage medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system, such as semiconductor fabrication system 820, for example. In some embodiments, design information 815 may include a netlist that specifies elements of a cell library, as well as their connectivity. One or more cell libraries used during logic synthesis of circuits included in integrated circuit 830 may also be included in design information 815. Such cell libraries may include information indicative of device or transistor level netlists, mask design data, characterization data, and the like, of cells included in the cell library.

As described above, memory circuits 110 included in system 100, as well as memory circuits 210 included in system 200, may be different instances of a same memory circuit design. In such embodiments, the common memory design may be a common block of code of any of the described hardware description languages. The different instances may, therefore, be implemented as repeated calls to the common block of code and/or by inserting the common block of code into design information 815 for each instance.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown or described herein. Further, integrated circuit 830 may be configured to perform various functions described herein in conjunction with other components.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation-[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(*f*) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:

a memory controller circuit;

a first memory circuit coupled to the memory controller circuit, wherein the first memory circuit includes:

a plurality of first memory cells;

first local access circuitry; and a first set of repeater circuits;

a second memory circuit coupled to the first set of repeater circuits, wherein the second memory circuit includes a plurality of second memory cells and second local access circuitry; and wherein the memory controller circuit is configured to:

place the first memory circuit into a reduced power state; and access the second memory circuit via the first set of repeater circuits.

2. The apparatus of claim 1, wherein the first memory circuit is configured to:

power down the plurality of first memory cells and the first local access circuitry; and retain power to the first set of repeater circuits.

3. The apparatus of claim 1, wherein the first set of repeater circuits is coupled to the second local access circuitry and is configured to:

receive information read by the second local access circuitry from the second memory circuit; and relay the received information to the memory controller circuit.

4. The apparatus of claim 1, further comprising:

a third memory circuit coupled to a second set of repeater circuits included in the second memory circuit, wherein the third memory circuit includes:

a plurality of third memory cells;

third local access circuitry; and a third set of repeater circuits; and a fourth memory circuit coupled to the third set of repeater circuits, wherein the fourth memory circuit includes a plurality of fourth memory cells and fourth local access circuitry.

5. The apparatus of claim 4, wherein the memory controller circuit is further configured to:

place the second and fourth memory circuits into the reduced power state;

access, in a first bus cycle, the first memory circuit via the first local access circuitry; and access, in a second bus cycle, the third memory circuit via the first and second sets of repeater circuits.

6. The apparatus of claim 4, wherein the first and second memory circuits are respective instances of a common memory circuit design that correspond to least-significant bytes (LSB) of cache lines and the third and fourth memory circuits are respective additional instances of the common memory circuit design that correspond to most-significant bytes (MSB) of the cache lines.

7. The apparatus of claim 6, wherein the common memory circuit design includes:

a respective set of repeater circuits and a respective set of local repeater circuits; and a respective plurality of memory banks; and wherein the common memory circuit design is configured to:

use the respective set of local repeater circuits to couple one or more memory banks of the respective plurality of memory banks to the memory controller circuit; and use the respective set of repeater circuits to couple one or more adjacent memory circuits to the memory controller circuit.

8. The apparatus of claim 4, further including a plurality of data latch circuits coupled between the second and third memory circuits, and configured to latch information read from the third and fourth memory circuits.

9. The apparatus of claim 1, wherein the second memory circuit includes a second set of repeater circuits, and wherein the second set of repeater circuits are hard-wired in a power-down state.

10. A method comprising:

placing, by a memory controller circuit, a first memory circuit into a reduced power state, including:

reducing power to a plurality of first memory cells and a first set of local access circuits included in the first memory circuit; and retaining power to a first set of repeater circuits in the first memory circuit; and accessing, by the memory controller circuit, a second memory circuit via the first set of repeater circuits.

11. The method of claim 10, wherein reducing power to the plurality of first memory cells and the first set of local access circuits includes disabling a first power gate that supplies power to the plurality of first memory cells and disabling a second power gate that supplies power to the first set of local access circuits.

12. The method of claim 10, wherein the second memory circuit includes a plurality of second memory cells and a second set of local access circuits coupled to respective ones of the first set of repeater circuits; and wherein accessing the second memory circuit includes:

reading information from a portion of the second memory cells via a subset of the second set of local access circuits; and relaying the read information to the memory controller circuit via a subset of the first set of repeater circuits.

13. The method of claim 10, wherein the first memory circuit includes a set of multiplexor circuits, and wherein a given multiplexor circuit of the set is coupled to a respective local access circuit of the first set of local access circuits and a respective repeater circuit of the first set of repeater circuits.

14. The method of claim 10, wherein the first memory circuit includes a row decoder logic circuit, and wherein placing the first memory circuit into the reduced power state includes maintaining power to the row decoder logic circuit.

15. A system comprising:

first and third memory circuits that include respective first and third sets of repeater circuits, and coupled to a first subset of a plurality of power control signals; and second and fourth memory circuits that include respective second and fourth sets of repeater circuits, and coupled to a second subset of the plurality of power control signals;

a cache memory controller circuit coupled to the first memory circuit and configured to:

de-assert a portion of the second subset of power control signals, wherein the portion of the second subset of power control signals includes power control signals for memory cells in the second and fourth memory circuits;

access first cache information stored in the first memory circuit; and access second cache information stored in the third memory circuit via the first and second sets of repeater circuits.

16. The system of claim 15, further comprising a set of latch circuits coupled between the second and third sets of repeater circuits;

wherein the first and third memory circuits include respective first and third local access circuitry; and wherein the second and fourth memory circuits include respective second and fourth local access circuitry.

17. The system of claim 16, wherein the portion of the second subset of power control signals includes power control signals for the respective second and fourth local access circuitry.

18. The system of claim 16, wherein to access the first cache information stored in the first memory circuit, the cache memory controller circuit is configured to access, in a first bus cycle, the first memory circuit via the first local access circuitry; and wherein to access the second cache information stored in the third memory circuit, the cache controller circuit is configured to:

access, in the first bus cycle, the second cache information via the third local access circuitry;

store, in the first bus cycle, the second cache information in a subset of the latch circuits; and access, in a second bus cycle that is subsequent to the first bus cycle, the second cache information from the subset of the latch circuits.

19. The system of claim 15, wherein the first, second, third, and fourth memory circuits include respective row decoder logic circuits, and wherein the cache memory controller circuit is further configured to:

assert a power control signal excluded from the second subset of power control signals to maintain power to the respective row decoder logic circuit in the second memory circuit; and de-assert a power control signal included in the second subset of power control signals to disable power to the respective row decoder logic circuit in the fourth memory circuit.

20. The system of claim 15, wherein the first and second memory circuits are respective instances of a common memory circuit design that correspond to least-significant bytes (LSB) of cache lines and the third and fourth memory circuits are respective additional instances of the common memory circuit design that correspond to most-significant bytes (MSB) of the cache lines.

* * * * *